United States Patent
Bruce et al.

(10) Patent No.: US 11,625,661 B1
(45) Date of Patent: *Apr. 11, 2023

(54) SYSTEMS AND METHODS FOR CONTROL STRATEGY CRITERIA SELECTION

(71) Applicant: APPLIED PREDICTIVE TECHNOLOGIES, INC., Arlington, VA (US)

(72) Inventors: Anthony Bruce, Washington, DC (US); Zhichao Han, Arlington, VA (US); Genevieve Williams, San Francisco, CA (US)

(73) Assignee: APPLIED PREDICTIVE TECHNOLOGIES, INC, Arlington, VA (US)

( * ) Notice: Subject to any disclaimer, the term of this patent is extended or adjusted under 35 U.S.C. 154(b) by 327 days.

This patent is subject to a terminal disclaimer.

(21) Appl. No.: 16/594,999

(22) Filed: Oct. 7, 2019

Related U.S. Application Data

(63) Continuation of application No. 15/810,340, filed on Nov. 13, 2017, now Pat. No. 10,467,572, which is a continuation of application No. 15/047,199, filed on Feb. 18, 2016, now abandoned, which is a continuation of application No. 13/952,007, filed on Jul. 26, 2013, now Pat. No. 9,280,618.

(51) Int. Cl.
*G06F 17/10* (2006.01)
*G06Q 10/0639* (2023.01)
*G06F 30/20* (2020.01)

(52) U.S. Cl.
CPC ......... *G06Q 10/0639* (2013.01); *G06F 30/20* (2020.01)

(58) Field of Classification Search
CPC ....................................................... G06F 30/20
USPC .................................................. 703/2, 6, 22
See application file for complete search history.

(56) References Cited

U.S. PATENT DOCUMENTS

| | | | |
|---|---|---|---|
| 9,280,618 B1 | 3/2016 | Bruce et al. | |
| 2008/0120129 A1 | 5/2008 | Seubert et al. | |
| 2009/0254572 A1 | 10/2009 | Redlich et al. | |

*Primary Examiner* — Andre Pierre Louis
(74) *Attorney, Agent, or Firm* — Foley & Lardner LLP

(57) ABSTRACT

The systems and methods perform simulations in a systematic way as to minimize redundant data fetching and computations and reduce run-time. The systems and methods can cache information that can be used across multiple control strategies and speed up the process of simulation by several orders of magnitude. A business analyst can first generate a set of matching criteria that meets business intuition for the specific initiative and set of stores under analysis. A systematic approach in building similar sites models from control strategies that are combinations of this set of matching criteria can be applied to minimize data extraction and processing. The similarity function allows for the distance of each criterion to be combined linearly. Data for each matching criteria only needs to be extracted once but can be used in all control strategies that uses that criteria.

16 Claims, 17 Drawing Sheets

A table is populated for test locations and control locations 210

↓

Time periods are populated in the table 220

↓

Financial data is populated in the table 230

↓

Data is aggregated for the test and control stores 240

↓

Summarize and calculate lift 250

*FIG. 2*

| Matching criteria Id | Matching metric category | Seasonality/Growth/Size? | Matching attribute | Matching time period | Geographic Distance |
|---|---|---|---|---|---|
| 1 | Sales | Seasonality | NULL | 1 year | False |
| 2 | Sales | Growth | NULL | 1 year | False |
| 3 | Sales | Size | NULL | 1 year | False |
| 4 | Units | Seasonality | NULL | 6 months | False |
| 5 | NULL | NULL | Average Income | NULL | False |
| 6 | NULL | NULL | NULL | NULL | True |

*FIG. 6*

| CS Id | F1 | W1 (weight of F1) | F2 | W2 (weight of F2) | F3 | W3 (weight of F3) | Required Match Attribute |
|---|---|---|---|---|---|---|---|
| 1 | NULL | NULL | NULL | NULL | 1 | 1 | NULL |
| 2 | NULL | NULL | NULL | NULL | 1 | 1 | Brand |
| 3 | NULL | NULL | 1 | 1 | 2 | 1 | NULL |
| 4 | NULL | NULL | 1 | 1 | 2 | 1 | Brand |
| 5 | NULL | NULL | 1 | 2 | 2 | 1 | Brand |
| 6 | NULL | NULL | 1 | 1 | 2 | 2 | Brand |
| 7 | 1 | 1 | 2 | 1 | 3 | 2 | Brand |

*FIG. 7*

| Matching criteria Id | Test Store Id | Control Store Id | Required Match Attribute | Distance |
|---|---|---|---|---|
| 1 | 1 | 100 | None | 0.922399874772212 |
| 2 | 1 | 100 | None | 0.126645183382969 |
| 3 | 1 | 100 | None | 0.0842352015574069 |
| 4 | 1 | 100 | None | 0.717122851859383 |
| 5 | 1 | 100 | None | 0.243239749333581 |
| 6 | 1 | 100 | None | 0.953451988663589 |
| 1 | 1 | 100 | Brand | 0.963734028586174 |
| 2 | 1 | 100 | Brand | 0.0700903279253177 |
| 3 | 1 | 100 | Brand | 0.524466218752057 |
| 4 | 1 | 100 | Brand | 0.82246917399641 |
| 5 | 1 | 100 | Brand | 0.497826745332756 |
| 6 | 1 | 100 | Brand | 0.490878654984973 |
| 1 | 1 | 101 | None | 0.656429284914672 |
| 2 | 1 | 101 | None | 0.624185888345958 |
| 3 | 1 | 101 | None | 0.0272623671198918 |
| 4 | 1 | 101 | None | 0.337281485433692 |
| 5 | 1 | 101 | None | 0.432851476751256 |
| 6 | 1 | 101 | None | 0.640093591747069 |
| 1 | 1 | 101 | Brand | 0.567698486721579 |
| 2 | 1 | 101 | Brand | 0.850362820911244 |
| 3 | 1 | 101 | Brand | 0.260603651056923 |
| 4 | 1 | 101 | Brand | 0.0484603037296391 |
| 5 | 1 | 101 | Brand | 0.861307774397864 |
| 6 | 1 | 101 | Brand | 0.765692966439804 |

FIG. 8

| Control Strategy Id | Test Store Id | Control Store Id | Total Distance | Rank |
|---|---|---|---|---|
| 1 | 1 | 100 | 0.9223998747722212 | 2 |
| 1 | 1 | 101 | 0.656429284914672 | 1 |
| 2 | 1 | 100 | 0.963734028586174 | 2 |
| 2 | 1 | 101 | 0.567698486721579 | 1 |
| 3 | 1 | 100 | 1.049045058155181 | 1 |
| 3 | 1 | 101 | 1.280615173260630 | 2 |

*FIG. 9*

| Control Strategy Id | Test Store Id | Control Store Id |
|---|---|---|
| 1 | 1 | 101 |
| 2 | 1 | 101 |
| 3 | 1 | 100 |

*FIG. 10*

$$\text{Lift} = \frac{\text{(Average test value in the post period) / (Average test value in the pre period)}}{\text{(Average control value in the post period) / (Average control value in the pre period)}} - 1$$

*FIG. 11*

| Store Id | Pre or post | Average value |
|---|---|---|
| 1 | Pre | 0.727030113597889 |
| 1 | Post | 0.263290467397825 |
| 100 | Pre | 0.944018277924488 |
| 100 | Post | 0.979055108645353 |
| 101 | Pre | 0.322965246580557 |
| 101 | Post | 0.573970681333945 |

*FIG. 12*

| CS Id | Test Pre | Test Post | Control Pre | Control Post | Lift |
|---|---|---|---|---|---|
| 1 | 0.7270301135 | 0.2632904673 | 0.3229652465 | 0.573970681 | -79.622598 |
| 2 | 0.7270301135 | 0.2632904673 | 0.3229652465 | 0.573970681 | -79.622598 |
| 3 | 0.7270301135 | 0.2632904673 | 0.9440182779 | 0.979055108 | -65.081467 |

*FIG. 13*

| Rank | Histogram | Std. Deviation Weighted Lift | Average Weighted Lift | Percent Error Read | Model Description | Analysis Description |
|---|---|---|---|---|---|---|
| 1 | | 2.35 | -0.36 | 3.57% | Attribute - Demo - Income - Average Household Income - 05 mi - 2005; Weight 2<br>Seasonality - Units - Weekly, Total, 180 days with 1 delay: Weight 1<br>Slope - Sales $ - Weekly, Total, 365 days with 1 delay: Weight 1<br>Number of Similar Sites : 20<br>Require Match On: none | Metric: Sales $ - Weekly<br>Category: Guitar<br>Preperiod Duration: 90<br>Pre/Post |
| 2 | | 2.35 | -0.36 | 3.57% | Attribute - Demo - Income - Average Household Income - 05 mi - 2005; Weight 2<br>Seasonality - Units - Weekly, Total, 180 days with 1 delay: Weight 1<br>Slope - Sales $ - Weekly, Total, 365 days with 1 delay: Weight 1<br>Number of Similar Sites : 20<br>Require Match On: Brand | Metric: Sales $ - Weekly<br>Category: Guitar<br>Preperiod Duration: 90<br>Pre/Post |
| 3 | | 2.39 | -0.17 | 3.60% | Seasonality - Units - Weekly, Total, 180 days with 1 delay: Weight 1<br>Geography: Weight 2<br>Slope - Sales $ - Weekly, Total, 365 days with 1 delay: Weight 2<br>Number of Similar Sites : 10<br>Require Match On: Brand | Metric: Sales $ - Weekly<br>Category: Guitar<br>Preperiod Duration: 90<br>Pre/Post |
| 4 | | 2.39 | -0.17 | 3.60% | Seasonality - Units - Weekly, Total, 180 days with 1 delay: Weight 1<br>Geography: Weight 2<br>Slope - Sales $ - Weekly, Total, 365 days with 1 delay: Weight 2<br>Number of Similar Sites : 10<br>Require Match On: none | Metric: Sales $ - Weekly<br>Category: Guitar<br>Preperiod Duration: 90<br>Pre/Post |
| 5 | | 2.39 | -0.47 | 3.92% | Attribute - Demo - Income - Average Household Income - 05 mi - 2005; Weight 2<br>Seasonality - Units - Weekly, Total, 180 days with 1 delay: Weight 1<br>Slope - Sales $ - Weekly, Total, 365 days with 1 delay: Weight 2<br>Number of Similar Sites : 20 | Metric: Sales $ - Weekly<br>Category: Guitar<br>Preperiod Duration: 90 |

SYSTEMS AND METHODS FOR CONTROL STRATEGY CRITERIA SELECTION

CROSS-REFERENCE TO RELATED APPLICATIONS

This application is a continuation of U.S. patent application Ser. No. 15/810,340, filed Nov. 13, 2017, which is a continuation of U.S. patent application Ser. No. 15/047,199, filed Feb. 18, 2016, which is a continuation of U.S. patent application Ser. No. 13/952,007, filed Jul. 26, 2013, which are all incorporated by reference in their entirety.

FIELD OF THE INVENTION

This invention relates generally to systems and methods for identifying matching criteria for a control strategy.

BACKGROUND

Businesses are increasingly using testing in order to learn about an initiative's effectiveness. The businesses will try an idea in a subset of the business and then compare how that tested subset's performance change over time compares to the non-test subsets of the business over the same time to measure the impact of the test and inform "go forward" decisions.

In one conventional example, the business is a retailer, and the subset of the business in which the test occurs is a set of test stores, which are then compared to control stores. The difference in the change in performance in test stores when the tested program is implemented to the change in performance in control stores over the same time is then attributed as the impact of the tested program.

In order to have an accurate measurement of test effectiveness, the measurement approach needs to set an effective baseline for how the test stores would have performed had they not received the test initiative. In other words, it is desirable to have a measurement approach such that if a program were to have no effect, the approach would measure no difference in the change in performance between the test and control stores. Therefore, it is desirable to pick the time periods, methods for handling seasonality, methods for handling "outliers" (unusual performance points), and strategy for selecting control stores that set the most accurate baseline for how the test stores would have performed had they not implemented the initiative being measured.

As an example, one aspect of the measurement approach is selecting the control stores that did not receive the program that will be used to compare change in performance against the change in performance in the test stores. How control stores are selected can be an important, but difficult, question. Control stores could be paired to test stores based on their similarity to the test store on certain matching characteristics. A variety of characteristics could be considered to be most relevant in selecting the control stores that are most similar to each test store. For example, control stores could be matched to test stores based on similar financial patterns (e.g., sales), such as seasonality (variation due to time of year), slope (general linear trend during a period of time), and volume. Store attributes such as demographics, and physical location are time-invariant characteristics that can be used for store matching. From a candidate control pool, control stores are found for each test store by calculating a distance measure that is composed of financial patterns and/or store attributes and finding the stores with the minimum distance to the test stores. The set of features to match on, called a control strategy, can be any number of features and weighted in any arbitrary manner.

The test for similarity is related to the strength of the null hypothesis. The null hypothesis asserts that given no action is being performed on a set of stores; there is no difference in performance of the test stores and their respective baseline control stores. In practice, the aggregate performance of a set of control stores should be as close as possible to the test store.

The current method of validating the "goodness" of the measurement strategy is by finding the variance of test versus control performance across a clean period when no action has occurred on both the test stores and control stores. Basically, a test can be simulated in which nothing has actually occurred in order to measure adherence to the null hypothesis. This involves randomly designating test stores from a clean group to set up tests that occur at random times. But nothing actually happened in these stores—they are arbitrarily and randomly designated as a test group. The measurement approach is then used to measure change in performance in the designated test group relative to control over the designated time periods. For example, if assessing K different strategies for picking a control group, a simulation program can apply the first strategy for selecting a control group, build the control group, and measure change in performance in the test group relative to the control group. This is repeated for each strategy for picking a control group being assessed, and the results are recorded. Once complete, it will start again and randomly pick a set of designated test stores and designated test dates for each test store. And again, each control strategy is applied and a change in performance is measured for the test group against the control group, and the results are recorded. This process can repeat several hundred times. The process will then calculate the results for each strategy across the several hundred simulations to assess which approach worked best.

The simulation program can evaluate the accuracy of each possible measurement approach against several dimensions. The first is how close to 0 the measurement approach was across the simulations. Because this is a null test, there should have been a measurement of no change in the designated test group relative to the designated control group. Therefore, the closer a measurement approach is to 0 is indicative of a more accurate measurement strategy. Another metric is average pre-period noise. Pre-period noise for a given run of simulation is a measure of how closely the model predicts the variation of the test stores in the pre-period. Strong control strategies can accurately predict each point of the test stores in the pre-period. Although some features are biased to performed better in pre-period noise and using this metric can lead to over-fit, this metric can provide a general indicator of how well the control strategy is performing.

The two main challenges of using simulations to search and validate control strategies is that it involves large volumes of data and a large number of computations since the space of control strategies is extremely large. Financial data needs to be extracted for long timeframes multiple times for many stores. The processing of the data to determine the test and control, pre versus post performance is computationally intensive. Simulations can take several hours to days to complete to evaluate one control strategy. The number of control strategies can be any combination of matching criteria that meets business intuition. Each matching criteria in a control strategy can be weighted differently to create even more control strategies.

SUMMARY

The systems and methods described herein attempt to provide a solution to these challenges in simulation by performing simulations in a systematic way as to minimize redundant data fetching and computations. The systems and methods can cache information that can be used across multiple control strategies and speed up the process of simulation by several orders of magnitude. A business analyst can first generate a set of matching criteria that meets business intuition for the specific initiative and set of stores under analysis. A systematic approach in building similar sites models from control strategies that are combinations of this set of matching criteria can be applied to minimize data extraction and processing. The similarity function allows for the distance of each criterion to be combined linearly. Therefore, data for each matching criteria only needs to be extracted once but can be used in all control strategies that uses that criteria. Test and control store pre-period and post-period performance can also be cached between control strategies. The systems and methods can optimize the process of building similar sites models that use control strategies that can share underlying data to drastically reduce the run-time of simulations.

With an ability to simulate many control strategies more quickly than conventional methods, the systems and methods described herein can analyze the impact of individual matching criteria in control strategies. Control strategies can be ranked by a result metric of the simulation, usually the standard deviation of weighted average lift. The "goodness" of each matching criteria can be examined by comparing the performance of the simulation whose control strategy contained a particular matching criteria with the simulations that did not. This can produce insights about the group of stores under simulation in general because it is a high level analysis across many control strategies. Previously, it was not possible to engage in this type of analysis because it would not be feasible to run enough simulations in order to reason about different features with analytical rigor.

It can be difficult to exhaustively compute for the null hypothesis the variance for each control group given the infinite number of combinations of weights that can be applied to each feature. However, the systems and methods described herein have an ability to examine its results and use heuristics based upon the best control groups generated and other feature analysis techniques in order to intelligently determine the next best control strategies to compute. No additional information is required to compute similar sites models for control strategies that only differ in the relative weights of their criteria. The systems and methods described herein can more quickly take the best control strategies given a measure of goodness (e.g., standard deviation of lift), build similar sites models, and calculate test versus control performance using cached data. This technique is shown to further reduce pre-period slope and noise of the initiative being analyzed.

In one embodiment, a computer-implemented method for identifying matching criteria to select a control strategy comprises receiving, by a server, a listing of a plurality of matching criteria; generating, by the server, a plurality of control strategies using a plurality of permutations of one or more matching criteria in the listing; randomly selecting, by the server, a plurality of test locations; creating, by the server, a plurality of null tests for a predetermined time frame based upon the randomly selected test locations; calculating, by the server, a similarity score for each matching criteria for each randomly selected test location paired with a potential control location; identifying, by the server, the most similar potential control locations for each test location for each control strategy; calculating, by the server, an aggregate lift for each null test by aggregating lift for each test location for each control strategy based upon the most similar potential control locations; and ranking, by the server, the control strategies based upon the aggregate lift.

In another embodiment, a computer program product embodied on a non-transient computer readable medium, wherein the computer program product has instructions that when executed by a processor perform the method comprising receiving, by a server, a listing of a plurality of matching criteria; generating, by the server, a plurality of control strategies using a plurality of permutations of one or more matching criteria in the listing; randomly selecting, by the server, a plurality of test locations; creating, by the server, a plurality of null tests for a predetermined time frame based upon the randomly selected test locations; calculating, by the server, a similarity score for each matching criteria for each randomly selected test location paired with a potential control location; identifying, by the server, the most similar potential control locations for each test location for each control strategy; calculating, by the server, an aggregate lift for each null test by aggregating lift for each test location for each control strategy based upon the most similar potential control locations; and ranking, by the server, the control strategies based upon the aggregate lift.

In yet another embodiment, a computer-implemented method for identifying criteria for a control strategy comprises receiving, by a computer, a plurality of criteria; calculating, by the computer, a similarity of criteria for each pair of a test location and a potential control location in a null test; generating, by the computer, a plurality of control strategies based upon various permutations of one or more of the criteria; identifying, by the computer, at least one of the most similar control locations for each test location for each control strategy; aggregating, by the computer, a lift of the most similar control locations for each test location for each control strategy; and ranking, by the computer, the control strategies based upon the aggregated lift for each control strategy.

Additional features and advantages of an embodiment will be set forth in the description which follows, and in part will be apparent from the description. The objectives and other advantages of the invention will be realized and attained by the structure particularly pointed out in the exemplary embodiments in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The methods, systems and/or programming described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 2 shows a process according to an exemplary embodiment.

FIG. 6 shows a table according to an exemplary embodiment.

FIG. 7 shows a table according to an exemplary embodiment.

FIG. 8 shows a table according to an exemplary embodiment.

FIG. 9 a table according to an exemplary embodiment.

FIG. 10 a table according to an exemplary embodiment.

FIG. 11 shows a formula according to an exemplary embodiment.

FIG. 12 shows a table according to an exemplary embodiment.

FIG. 13 shows a table according to an exemplary embodiment.

FIG. 14 shows a graphical user interface according to an exemplary embodiment.

FIG. 15 shows a graphical user interface according to an exemplary embodiment.

DETAILED DESCRIPTION

Various embodiments and aspects of the invention will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present invention.

The exemplary embodiments described herein attempt to make the process of finding a good control set faster and easier. From a computation perspective, the exemplary embodiments allow orders of magnitude greater numbers of control strategies to be evaluated than the traditional simulator. This can be accomplished by extracting data, performing parts of similar sites matching, and performing other calculations in batch. From a user's point of view, it is much faster to create these strategies in batch using a list of features and some logic around the maximum number of features per strategy rather than having to input a single strategy at a time.

As used herein, a test can be an experiment that is conducted on a per location basis. A test location can be where the test is conducted, though as discussed below, a location can include any type of store, site, or entity. A pre-period is a time period before the test is conducted, whereas a post-period is a time period after the test is conducted. A time frame is a period of time that corresponds to the pre-period and post-period.

A matching criteria can be any characteristic of a store. For example, a matching criteria can be any financial pattern (also referred to as "seasonality"), slope of the financial pattern, size of the store (in terms of dollar amount sold), a relatively static characteristic of the store such as mean income within a certain radius (e.g., within 3 miles), or the store location in terms of latitude and longitude. These matching criteria can be used as weighted variables for control strategies. Seasonality uses financial trends of performance metrics, such as sales dollars, to determine similarity between stores. The process of trying to match up these financial trends is referred to herein as financial pattern matching.

The systems and methods described herein use an activity analysis, which is a process of using an algorithm, described herein, to statistically analyze the impact of a test. The algorithm can be used to determine similar sites, which are control locations that are most similar to a given test location.

Figure 1:
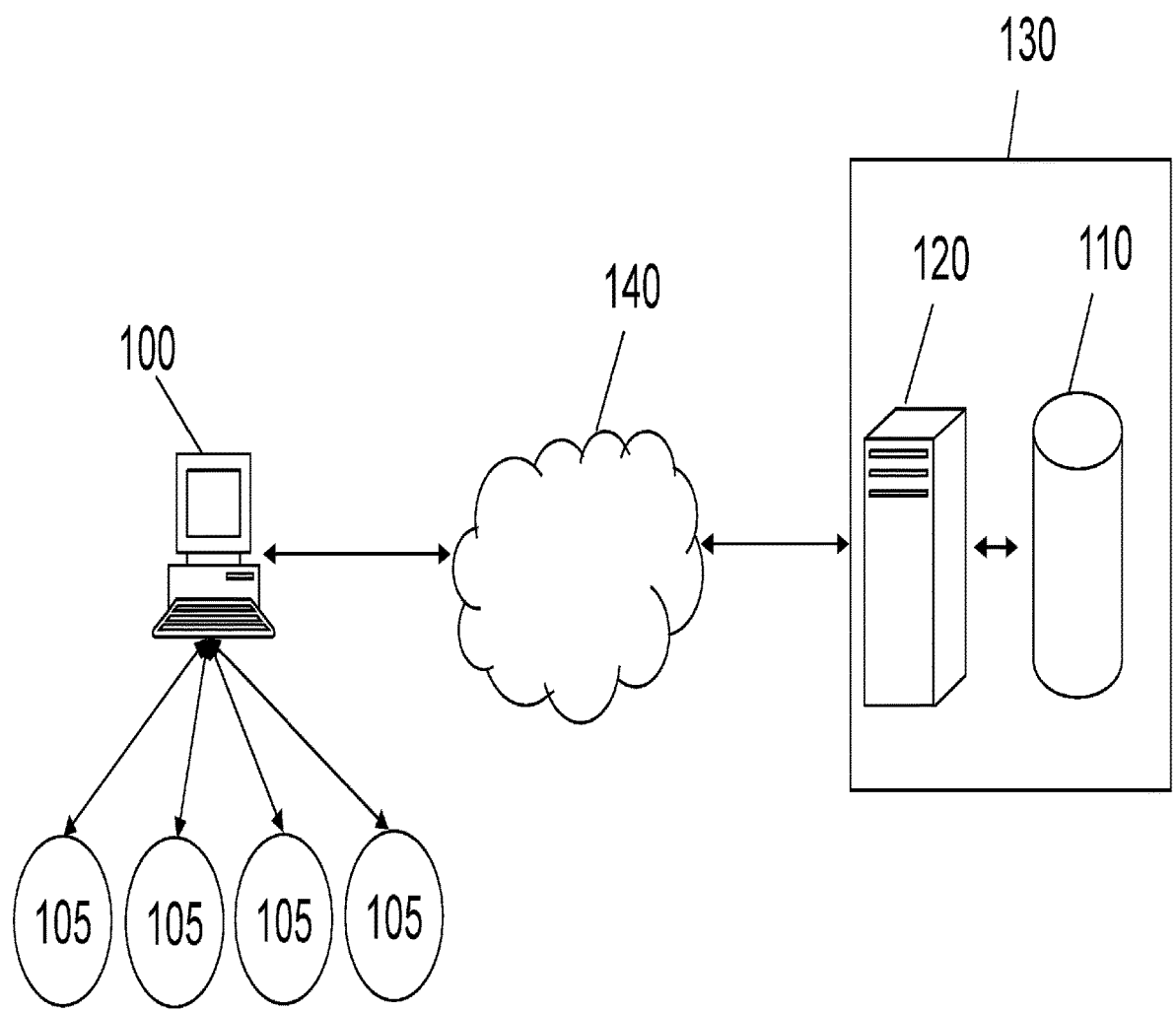
FIG. 1 shows a system overview according to an exemplary embodiment.

Referring to FIG. 1, an exemplary system diagram is shown. A client has a business network comprised of various entities 105, which may be business locations, stores, sites, students, accounts, customers, products, services, regions, patients, or other types of entities. In the exemplary embodiment, the entities represent a physical place where a company conducts business, such as a bank branch, a retail store, or a restaurant, though it is intended that the location can be any one of multiple places or sites that a company can conduct business. Further, although the exemplary embodiment often refers to the entity as a "location," it is intended that any type of entity can be used. The entities 105 may provide similar products and/or services to customers. In some embodiments, the entities 105 may be geographically dispersed.

A client computer 100 can represent one or more computers of the client, who may manage the various entities 105 or track data regarding the entities 105. In one example, for a consumer business, the client can be an organization headquarters or a marketing division for one or more entities 105 (e.g., a grocery store chain that determines which products and/or services each retailer location should provide). In some embodiments, each entity 105 can have its own client and computer 100. In other embodiment, a client and the computer 100 can be used for multiple entities 105. One or more users (not shown) may operate the computer 100. The computer 100 can be a desktop computer, workstation, laptop, personal data assistant, tablet computer, mobile phone, or any other similar computing system operated by a user. The computer 100 may use its processor to execute browser software stored in memory that enables a user to request, receive, and render information from a network 140.

The network 140 may be a shared, public, or private network and may encompass a wide area or a local area. The network 140 may be implemented through any suitable combination of wired and/or wireless communication networks. For example, network 140 may be implemented through a wide area network (WAN), local area network (LAN), an intranet, and/or the Internet. Further, network 140 may represent multiple networks, such as a wireless carrier network connected to the Internet.

The computer 100 transmits or otherwise provides historical data regarding entities 105 to a host entity 130. In this exemplary configuration, the host entity has a server 120 is coupled to the database 110, though the server 120 and the database 110 can be combined into a single device or each comprise multiple devices. The server 120 can be a computer system such as a desktop computer, workstation, or any other similar server side computing system that performs one or more service-side processes. The server 120 can have an interface unit for communicating information to and from the client's computer 100 over the network 140. In some embodiments, the server 120 may communicate with another server, such as a web server, that can more directly communicate over the network 140. The server 120 can use its processor to execute a computer program stored in memory that can access and analyze the data stored in the database 110.

The database 110 can comprise one or more memory devices that store data and/or executable software that is used by the server 120 to perform processes consistent with certain aspects described herein. The database 110 may be located external to server 120 and accessible through the network 140 or other network, such as a dedicated back-end communication path. In one embodiment, the database 110 can be located at the client or another location, such as with server 120. The database 110 can be populated with records about the client's historical data for various locations, sales, promotions, pricing, personnel, and the like. The client computer 100 can communicate with the server 120 to request analysis and view results.

In one embodiment, the client uses computer 100 to communicate over the Internet 140 with the host entity's server 120. The computer 100 may use a "thin client" program, such as a web browser, which accesses a website hosted by the host entity 130. The client may be prompted to enter a username and password into the web browser on the computer 100. The client can be authenticated to access data and perform analysis of that data. Alternatively, the client may request that another entity, such as the host entity 130 perform the analysis of their business initiative. The systems and methods described herein can be implemented as a computer program product embodied on a computer readable medium of computer 100 or server 120, and one or more steps of the process can be implemented as a module of the computer program product.

In order to analyze a business initiative, inputs may be entered on a graphical user interface at the client computer 100 or host server 120. These inputs can assist in defining the algorithm or limit the scope of the calculations. The inputs can be entered manually on the graphical user interface and/or automatically selected and entered.

Inputs can include, but are not limited to, a test location pool, a performance metric, a period of time, and a control group strategy. When inputting a test location pool, test locations for a simulation can be selected from a single group or a list of groups. The combination of all locations within all selected groups creates the pool of test locations that are available to be selected randomly as test locations in each individual activity analysis run that takes place as part of a simulation. The system can receive an input that identifies one or more metrics to analyze in the simulations. The metric can be a variable or a pattern over time. For example, a performance metric may be gross sales. The system can calculate lift or other performance change using this metric.

A time frame can be inputted. In addition to selecting a random subset of locations, the simulator also allows those test groups to be run across different time frames. Time frames can be added by uniformly distributing them over a set testing period, added individually by specifying pre and post periods, or added by selecting a list of dates.

Figure 17:
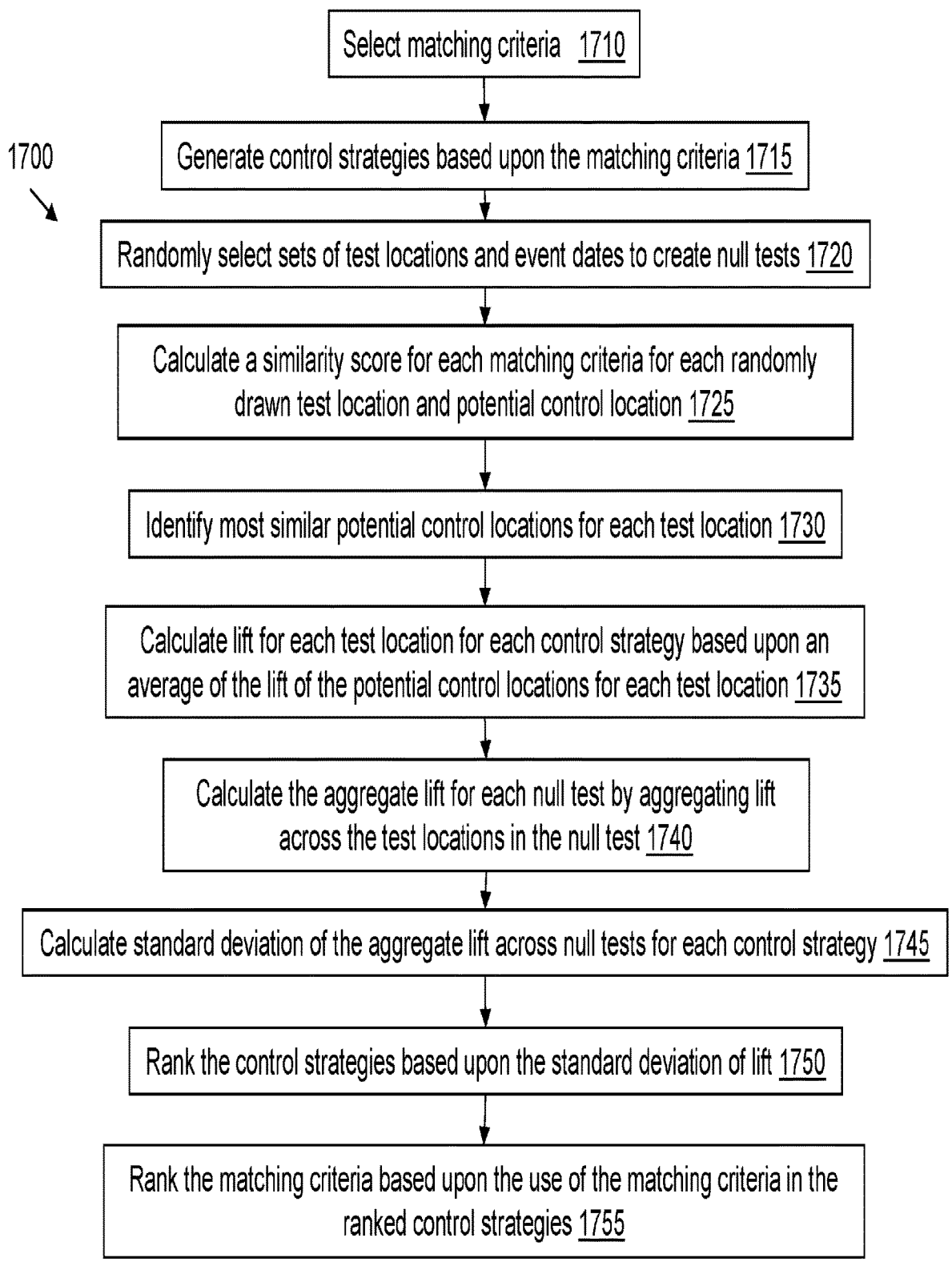
FIG. 17 shows a process according to an exemplary embodiment.

In FIG. 17, an exemplary method 1700 is shown for identifying matching criteria to select a control strategy.

A control group strategy is a method used to select a control location. Each control group strategy can be based upon a different permutation of inputted matching criteria for matching control locations to each test location. However, creating numerous control strategies can consume a lot of processing time. The exemplary embodiments can allow users to generate multiple control strategy mappings at once by leveraging batch processing. The control group strategy can include a few different sub inputs, including one or more matching criteria, logic for strategies to be created, a number of similar locations, and automated control strategy search. The system may require specific criteria that must be matched such as seasonality.

In step 1710, a client computer or host server receives a list of a plurality of matching criteria. The matching criteria for a control strategy can be selected from a list. Every control strategy that gets evaluated by the system will consist of some subset of these matching criteria. The matching criteria may be selected by a user.

Matching criteria can be classified into the following three types: static attributes; geographic location; and financial trends. A static attribute is a semi-permanent fact about a physical location that can change slowly over time, such as quality of signage or median income of a store. Locations that cater to similar demographics, for instance, are likely to exhibit similar sales patterns, such as a number of competitors in a 1 mile radius, population density in a 3 mile radius, median income within a 3 mile radius, whether the store is in a mall, etc. These kinds of location attributes can be predictive of sales trends.

A geographic location is typically provided by the location's latitude and longitude. We have observed that locations close to one another experience similar weather, marketing, etc., and hence are likely to exhibit similar financial patterns.

Financial trends are performance metrics such as sales dollars that are tracked by locations over time. For instance, a test location in a college town is likely to experience a decline in sales during the summer months and should often be compared with a control location that has a similar financial pattern.

The criteria may also specify required match attributes. A match on non-ordinal attribute would reduce the candidate control pool to control locations that have the same attribute value as the test location. This limits test to control combinations to those that satisfy business intuition (e.g., attributes associated with a "big box" store or a smaller store, an attribute associated with a particular state).

The system receives a plurality of inputs, including matching criteria and control strategy settings. For example, matching criteria can include seasonality of sales over the year prior to analysis, growth of sales over the last year prior to analysis, total volume of sales over the last year prior to analysis, seasonality of units sold over the 6 months prior to analysis, average income of population within 5 miles, and geographic distance.

Brand may also be considered. When brand is identified as a required match, the system may require that only stores of the same brand be matched together. Brand is not a matching criteria, because it does not contribute a similarity or distance score like the other matching criteria, so can be is treated separately.

A number of matching criteria that can be selected for exhaustive search may be restrictive given that the time it takes to run the simulation scales exponentially with the number of matching criteria. Users often want to explore many different matching criteria and running an exhaustive search with very few restrictions on control strategy will likely have large memory and run-time implications. However, out of the large number of control strategies that are computed, only a small percent of the best control strategies may be useful. Applying a search algorithm can make searching of many matching criteria feasible by using multiple iterations and limiting the number of control strategies under consideration at each iteration to avoid performance issues. The metric of "goodness" (i.e., standard deviation of lift) can also be used as an optimization criterion in the search algorithm. The search algorithm starts from control strategies with very few matching criteria and, at each iteration, adds matching criteria to the best performing control strategies. Duration each iteration, it also tries to insert random control strategies for consideration to avoid local minima. The user inputs a maximum number of control strategies to examine and the search algorithm uses that as the stopping criteria.

Control strategy settings may include logic for strategies to be created, such as a maximum number of criteria per strategy, whether certain required attributes should be cycled through or added to every strategy, whether seasonality is required, and how the different criteria should be weighted in each control strategy. In one embodiment, an option to require a seasonality match can be used to filter out models without a seasonality match on a particular metric. In many situations, control strategies may contain at least one seasonality match for it to produce accurate models. A user can also input different numbers of similar locations matched to each test location with minimal incremental machine time.

Another control strategy setting can include a list of the possible number of control locations matched to each test location. In this example, the system can report results from models built from the top 10 or 20 control locations matched to each test location.

Figure 3:
FIG. 3 shows a graphical user interface according to an exemplary embodiment.

In one exemplary embodiment, a graphical user interface 300 is shown in FIG. 3 whereby a user can select matching criteria and control strategy settings. In this example, 564 control strategies are produced given the selections shown in the graphical user interface 300. Control strategy options (also referred to herein as control strategy settings) include a number of similar control sites for each test site, so a user has selected 10 or 20 similar control sites for each test site. Also, the user has inputted that the system will choose a maximum of three matching criteria per control group strategy, (e.g., algorithm will make only strategies from 1, 2, or 3 matching criteria of the 6 available matching criteria). Another option includes an ability to vary weights for each matching criteria. Each matching criteria produces a distance score between a test and a candidate control store. A higher weight on a matching criteria would emphasize the distance of this matching criteria more than other when aggregating across all matching criteria in a strategy. Another option includes requiring at least one seasonality matching criteria. Typical control strategies have at least one seasonality matching criteria. Another option includes iterating on required match attributes. This option instructs the algorithm to create control strategies without any required match attributes and then iteratively add each required match attributes by itself. In this example, the algorithm will try all previously allowed combinations of matching criteria without requiring match on brand and then requiring a match on brand.

In this example, the graphical user interface 300 also allows selection of matching criteria. As shown in FIG. 3, a user has selected to use weekly sales, which is matched on slope and size, as well as weekly units, average household income, and geographic distance.

Figure 4:
FIG. 4 shows a graphical user interface according to an exemplary embodiment.

Time frames can be evenly distributed across a period of time where no significant activity is observed. A pre-period length can be varied by adding a comma delimited list of pre-period durations. In this example, as shown in a graphical user interfaces 400, 410 of FIG. 4, an algorithm will calculate results for 20 time frames, half of which are 45 day pre-periods and the remaining half are 90 day pre-periods, based upon entries in the graphical user interface 410.

One modeling parameter that can be varied in the system is the duration of the pre-period. Although the post-period is intuitive from the nature of the initiate under analysis, the length of time used for comparison before this period of activity can be less clear. Simulation can also be used in order to prove the validity of a pre-period duration. The system can optimize for varying pre-period durations by retrieving data for the largest pre-period duration and aggregating for multiple subsets of the pre-period to get multiple aggregated values, each corresponding to a pre-period duration. One result is thus computed for each control strategy and pre-period duration.

The same type of analysis can be performed on other parameters of control strategy. The user can vary the number of similar sites in their control strategy. To analyze the effect of this parameter, the system looks at all control strategies that differ only in this parameter and rank each value of this parameter based on its average performance against other control strategies that has a different number of similar locations. The same can be done for different required match attributes and pre-period durations. The user can iteratively eliminate poorly performing values in these categories in the same fashion as for matching criteria to find the best values.

Figure 5:
FIG. 5 shows a graphical user interface according to an exemplary embodiment.

Other control settings can include parameters for a random draw of null activities. In this example, as shown in a graphical user interface 500 of FIG. 5, in each time frame, 20 random draws of 20 stores from a group of 214 stores generate 20 null activities for each time frame. Another option is a metric of interest. A lift for each null activity can be calculated based upon a metric category of interest. In this example, the best matching criteria for a model can be selected to predict weekly sales of guitars.

In an effort to more efficiently process the information required to determine the best control strategy, the system populates a few tables and uses the stored information to assist with later calculations. The system populates a few tables: a control strategy table, a distance table for similar sites matching, and a pre/post aggregate financial table. Each of these tables can be stored in a server or an associated database. These tables contains information to perform lift calculations for all of the requested control strategies with a minimal amount of pulling and aggregating of raw financial data. Storing information in this structure can assist in exploiting cached information in an efficient way. Each of these tables can be utilized by the system through the use of one or more software modules that call upon each table for the data and perform calculations and computations with this data by a processor. For example, the system may use a control strategy module on a computer readable medium and executed by a processor that identifies one or more metrics associated with each of a plurality of control strategies, a distance module on a computer readable medium and executed by a processor that identifies a distance between a test location and a candidate control location of a plurality of control locations for each metric, an aggregate financial module on a computer readable medium and executed by a processor that identifies financial data for the test location and each of the plurality of control locations during a pre-period and a post-period, and a lift module on a computer readable medium and executed by a processor that calculates an aggregated distance between for the lift in each metric in each control strategy using the control strategy module, the distance module, and the aggregate financial module.

In step 1715, the client computer or host server generates a plurality of control strategies using a plurality of permutations of one or more matching criteria in the listing. FIG. 6 shows a listing of matching criteria and each criteria's associated features. FIG. 7 shows an exemplary control strategy table of seven control strategies based upon three matching criteria F1, F2, F3, which may be selected from the table shown in FIG. 6. FIG. 7 shows which of these matching criteria F1, F2, F3 is included in that particular control strategy and the corresponding weighting of that matching criteria.

As shown in FIG. 7, the control strategy table can be populated using one or more inputted control strategies. From the user inputs of a list of matching criteria and business logic that defines any restrictions on these combinations, a set of control strategies can be systematically generated. This is represented by a table that contains for a given control strategy identifier, the list of matching criteria and their respective weights and, if any, required match attributes. Normalizing control strategies into this structure allows the system to construct many similar sites models in a single large set-based operation. It can provide a clear interface that maps directly to information on the similar sites distances table. Business logic, such as requiring a match on seasonality criteria or iterating on require match attributes, can be captured and translated into such interface.

In step 1720, the client computer or host server randomly selects a plurality of test locations and event dates to create a plurality of null tests for a predetermined time frame based upon the randomly selected test locations.

In step 1725, the client computer or host server calculates a similarity score for each matching criteria for each randomly drawn test location and potential control location. In an exemplary embodiment, the similarity score can be calculated using a distance function, though any similarity calculation may be used. For each of the n matching criteria, there is a distance function such that for given a test location and a potential control location, the distance D(t, c, k, p) for the $k^{th}$ matching criteria normalized to the $p^{th}$ control pool can be computed. In order for distances between metrics to be fairly compared, the distances for each test location to control location can be normalized to the control pool by dividing by the standard deviation of distances. Control pools can differ for a test location if there is a required match attribute between test and control. The combined is the sum of normalized distance between test location and control location for all matching criteria. In aggregating the distances, matching criteria can be weighted differently. Let wk represent the weight of the $k^{th}$ matching criteria. Then the combined distance between the test location and the control location on the basis of these matching criteria is given by:

$$D(t, c, p) = \sqrt{\sum_{k=1}^{n} w_k^2 D(t, c, k, p)^2}$$

A distance between a test location and candidate control locations for each matching criteria is calculated using a similar sites algorithm, as shown in a similar sites distance table in FIG. 8. As shown in FIG. 8, for each test store, the system calculates a distance for each control store for each of six matching criteria using no required match attribute and a required brand match attribute. Required match attributes can be displayed in a separate column because the distance score can be normalized to each control pool, which is different for each required match attribute.

As shown in FIG. 8, the similar sites distances table contains, for a particular test and candidate control pairing, similar sites distances along a particular metric normalized to a particular control pool. Storing the distances data at this level of granularity allows the system to compute the similar sites model for any control strategy. The number of matching criteria that satisfies business intuition can be of manageable size whereas the domain of control strategies, formed by combinations of these matching criteria, can be very large.

The calculation of this distance table is the same as the intermediate distances table when constructing a similar sites model of every possible matching criteria. To handle iterating on the required match attributes, the system iteratively calculates and stores the distances for each set of control pools that the required match attributes indicates.

In this exemplary embodiment, to calculate the similar sites model for a given control strategy, the distance between every test and candidate control location can be calculated by summing the similar sites distances for each matching criteria multiplied by the square of its weight indicated by the strategy. All of the necessary information can be found in the control strategy table, shown in FIG. 7, and similar sites distance table, shown in FIG. 8. To get a similar sites model mapping of the best control locations, the algorithm rank orders test to control combinations by their aggregate distance across matching criteria and takes the top subset of combinations indicated by the control strategy. The output is a table that describes, for each control strategy, the test to control mappings. Another optimization made in this step is that the system can leverage the fact that many control strategies share matching criteria and respective weights but different number of control locations for each test location. Therefore, only the similar sites model with the most control locations is saved in this table because any model with less control locations per test location can be made by taking the top subset of control locations from the largest model.

This data model can improve performances by several orders of magnitude. To illustrate this point, for exhaustive combinations of X matching criteria with a maximum of Y matching criteria in each control strategy, the number of control strategies that contain any single matching criteria is exponential in both the number of matching criteria and the maximum number of matching criteria. In a typical run of the system where users compute thousands of similar sites models, the new methodology would return thousands of times faster than if each model were to be constructed separately.

In step 1730, the client computer or host server identifies the most similar potential control locations for each test location. Given a test location and a set of potential control locations, the system computer pairwise distances between each test location and every control location, and then the system chooses the best control locations based upon the closest locations, i.e., those with the lowest distance or highest similarity score. In the exemplary embodiment, the system uses a similar sites algorithm to map a test location to a control location for each test location by identifying the N control locations that are most similar to that test location. The similar sites algorithm finds the closest locations on the basis of some user selected matching criteria that is relevant to the performance of a location. This algorithm is often considered current best practice for finding a good control. Exemplary methods are described in U.S. patent application Ser. No. 13/185,559, filed Jul. 19, 2011, entitled "Methods, Systems, and Articles of Manufacture for Analyzing Initiatives for a Business Network," which is hereby incorporated by reference in its entirety. This algorithm can consistently outperform the more simplistic approach of just picking one group of untested locations to form the control group.

As shown in FIG. 9, an aggregated distance (or other similarity score) between each test and candidate control pairing can be calculated for each control strategy. Using the matching criteria and weighting algorithm based upon the information in the control strategy table in FIG. 7 and a distance for each matching criteria in FIG. 8, the system can calculate a total distance of each control strategy in a more efficient manner. The control locations can then be ranked for each control strategy based upon the calculated distance. In this example, each of the two control locations is ranked for each control strategy. The system may then proceed with one or more of the highest ranked potential control locations.

In step 1735, the client computer or host server calculates lift for each test location for each control strategy based upon an average of the lift of the potential control locations for each test location.

In one embodiment, an activity analysis algorithm can calculate a measurement of test performance called lift. Lift is a measure of how much the test stores are outperforming the control locations. Activity analysis can use the following inputs: a list of locations and the dates on which the test begins and ends in those locations; a definition of the time before the test that the user wants to treat as the pre period for the test; and a definition of the time after the test that the user wants to treat as the post period for the test, which could be fixed set of dates or could be the time period between the current date and the day the test ended.

As shown in FIG. 2, an activity analysis algorithm operates as follows. In step 210, a table is populated for test locations and control locations. The control locations table is populated using a similar sites model that is computed using some set of matching criteria. In step 220, time periods are populated in this table, including pre period and post period for every location. In step 230, financial data is populated into this table. Financial data is requested from a minimum date to a maximum date. This can lead to larger extracts than are actually needed, but in the subsequent financial aggregation steps, it can ensure aggregation of the right subset of data for each location. In step 240, data is aggregated for the test and control locations. Using the definition for the pre-periods and the post-periods, the financial information is aggregated so that for each test location and each control location, there is a measure of performance in the pre period and performance in the post period.

In step 250, the system summarizes and calculates lift. A calculation of lift can uses the following symbols: TP1=average value of the test location in the pre period; TP2=average value of the test location in the post period; CP1=average value of the control locations in the pre period; and CP2=average value of the control locations in the post period. The control locations associated with each test location can be used to calculate the expected performance of the test locations:

Expected Post=$TP1*CP2/CP1$

The system can fetch and aggregate pre-period and post-period data for each test and candidate control location for a metric of interest, such as lift. Lift can be calculated from a ratio of test versus control and pre-period to post-period performance. As shown in FIG. 11, a measure of how much the test location is outperforming the control location is called lift and is measured by:

$$\frac{TP_2/TP_1}{CP_2/CP_1} - 1$$

Lift calculations are computed in batch instead of iterating through each control strategy and pre-period duration. The aggregated distance for each control for each test location for all control strategies is first computed from the joining of test to control mappings to the pre/post aggregated values for those particular control locations. With the test location pre/post and its aggregated control calculated, the lift calculation is performed for all control groups simultaneously.

The system can leverage the intermediate results of calculating overall lift as well as minimizing the number of data points that need to be sequenced and stored. Reusing the control pre-period and test pre-period values from the previous calculation can greatly reduce the amount of computation involved. In addition, the same data point may be used as test or control in many control strategies and both the sequencing and the data storage occurs only once for every distinct location. The similar sites mappings allows the correct calculations while minimizing the overhead of indexing and storing data. By storing the populated control strategy table and similar sites table in the server (or associated database), the system can more efficient perform calculations for each control strategy in the control strategy table by selecting previously-computed components from the other tables rather than performing the same calculations in a duplicative manner for each control strategy.

The output for a simulation ran for a particular control strategy and other analytic parameters such as pre-period duration and a particular metric category is a set of lifts and pre-period slope and noise measures for each randomly generated test. The "goodness" of a set of modeling parameters is measured by the standard deviation lift across a set of null tests. The average lift can also indicate any significant bias that the control strategy is introducing and can serve as a filter for such control strategies. The metrics of average pre-period noise and slope in general are not used as a deterministic measure of goodness, but to understand the domain of reasonable pre-period noise and slope values given the general behavior of the network.

Each control strategy is associated with a test location and a control location, as shown in FIG. 10. For each null activity, the system can calculate an average value for each test location and each control location in a pre-period and a post-period, as shown in FIG. 12. Using these calculations and the algorithm described above, the system can compute lifts for each control strategy, as shown in FIG. 13.

As shown in FIG. 13, in order to perform the lift calculation, the pre/post aggregate financial value for all test and control locations is calculated. The logic for this financial extraction and aggregation is the same as it would be for a normal analysis except that it is performed for all test union candidate control locations. The result of this is a pre/post aggregate financial table that aggregates financial values for each location the pre and post periods. The pre/post aggregate financial table in FIG. 13 provides information for calculating lift using any similar sites model.

Using one aggregated table for all test and control locations is significantly more efficient than constructing the same table but for a particular set of test locations and their control locations from one similar sites model. The largest performance enhancement comes from the fact that the financial extraction only takes place once instead of once per similar sites model. The raw financial extract is organized by metric, date, category, and lastly, the individual locations. It is far more efficient to extract financial data once for the metric, date range and category with no filtering on the location than it is to extracting financial data for the specific stores in a similar sites model.

In addition, summing up all data points for a location in the pre and post period can be expensive, especially for daily data over long durations. Many of the similar sites models may contain the same control location and thus the same pre-post aggregated value. This is not only drastically saves computation but also reduces the amount of data that needs to be stored. A large table of similar sites models can contain test to control mapping for each control strategy and simply point to pre/post aggregated values in another table with no data repetition.

An algorithm used herein can efficiently compute and evaluate several control strategies in batch. To understand the optimizations made by this algorithm, the activity analysis algorithm and the similar sites algorithm are examined. The concept of control group fit is also described. Once these algorithms have been described, the algorithm will be described in terms of the modifications it makes that enables it to batch process control strategies.

A control group fit module examines the fit of the control strategies when modeling the pre-period of the test locations. It can provide a number of metrics to help the user understand if there is a mismatch between test and control locations. It can also provide a visual of a trend chart that can be used to determine whether this mismatch will continue into the post period. If there is an inherent bias between test and control locations that extends into the post period, the user would have to account for this before getting a proper read regarding whether the experiment was successful.

The module works by computing the lift for every time period (for example, weeks for a weekly metric) in the pre-period. These lifts are plotted on the control group fit chart (whereby the x-axis represents these periods and the values on the y-axis represent lift) where "control pre" is the average metric value for a control location in the pre-period and "test pre" is the average metric value in the pre-period, and "control post" and "test post" are the metric value for control and test locations for a particular date in the pre-period, respectively. The resulting lift values are then readjusted so that the average is 0. Then one measure of goodness of fit is the standard deviation of the y values. This is called the "noise" in the control group fit. If test and control locations are well matched, one would expect a noise close to 0.

While using the test versus control methodology, it is often considered best practice to come up with a few different candidate control groups and then use the control group fit module to evaluate each for noise in the pre-period.

Because running control group fit can be an important part of evaluating control groups, the system uses its caching methodology to ensure that it can run control group fits for each proposed strategy in a reasonable amount of time.

In step 1740, the client computer or host server calculates an aggregate lift for each null test by aggregating lift across the test locations in the null test. Additional information on individual matching criteria can be gathered by looking at their performance in aggregate. When doing an exhaustive search of all combinations of matching criteria, a certain matching criteria will appear in many control strategies. One can understand the "goodness" of individual matching criteria by seeing the average ranking of all simulations that contained that matching criteria. This can be useful in determining if the top control strategies in that ranked ordered list are good models or over-fitted models. Users can go through a process of iteratively eliminating matching criteria that performs poorly across many simulations until they arrive at a plurality of the best matching criteria and the best control strategies.

The client computer or host server can rank the control strategies based upon the aggregate lift, which can be a good indicator of accuracy of a model. In this exemplary embodiment, the control strategies are ranked using a standard deviation of the aggregate lift. As shown in FIG. 17, in step 1745, the client computer or host server calculates a standard deviation of the aggregate lift across null tests for each control strategy. In step 1750, the client computer or host server ranks the control strategies based upon the standard deviation of lift.

These steps can be repeated for each null activity using a random draw of test sites and time frame. FIG. 14 shows a graphical user interface displaying a standard deviation and average lift of all null activities for each control strategy. In this example, this table has 1128 rows, because it built 564 control strategies for 2 different pre-period durations. Each row is driven by 200 lift numbers from 200 null activities (20 random draws of test sites and 10 time frames). It is then ranked by standard deviation of lift.

One way to analyze the output of many simulations with different control strategies and pre-period durations is to rank order the simulations based upon the metric of "goodness," standard deviation of lift, and filter based upon the metric that indicate bias, average lift. One can arrive at the best control strategies by examining the top control strategies of this ordered list.

Figure 16:
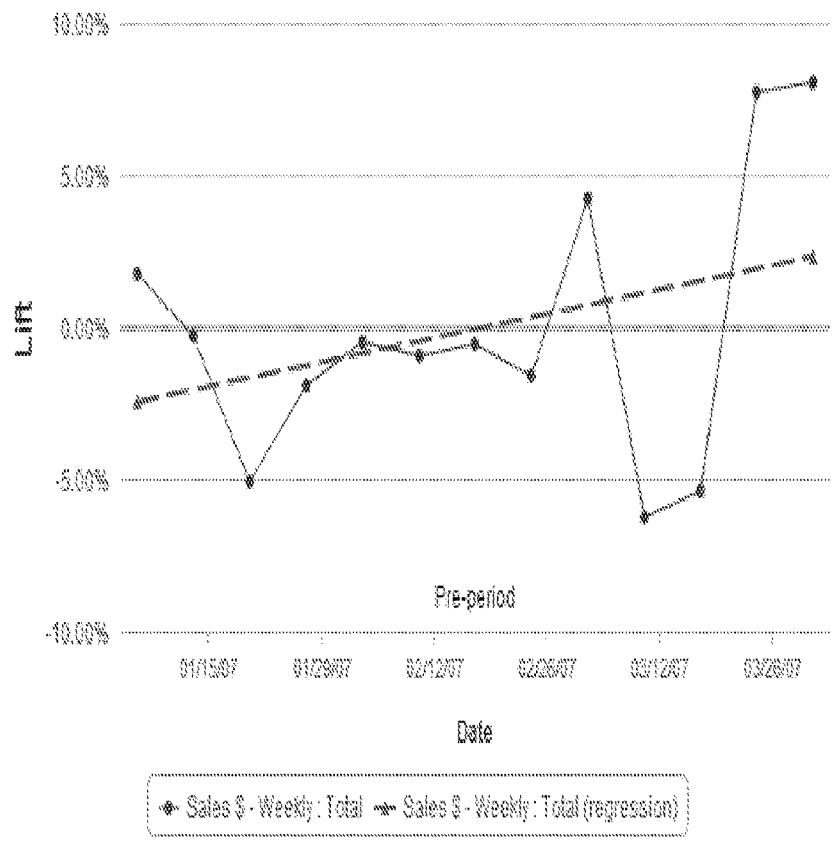
FIG. 16 shows a graphical user interface according to an exemplary embodiment.

In addition to standard deviation of lift, another metric of goodness for control strategies is noise in the pre-period. A good control strategy should be able to accurately predict the trend of the pre-period, which means that the control strategy were to predict each point of the pre-period as if it is the post-period, then there should be no lift calculated. Therefore, the system can calculate lift, instead of on the entirety of the post-period, on a single point of the pre-period and then calculate the standard deviation of lift within all pre-period points to compute a noise measure. A table similar to the table in FIG. 12 can be created except instead of post values, it would have a post value for each point in the pre-period. A table similar to the table in FIG. 13 can then be calculated for each point in the pre-period. Then, as shown in FIG. 16, a standard deviation of lift can be taken for all lift with the same control strategy to calculate noise for each control strategy. This can be performed for all null activities to produce an average noise for each control strategy. The same ranking and comparisons can be done with noise as standard deviation of lift.

Figure 15:
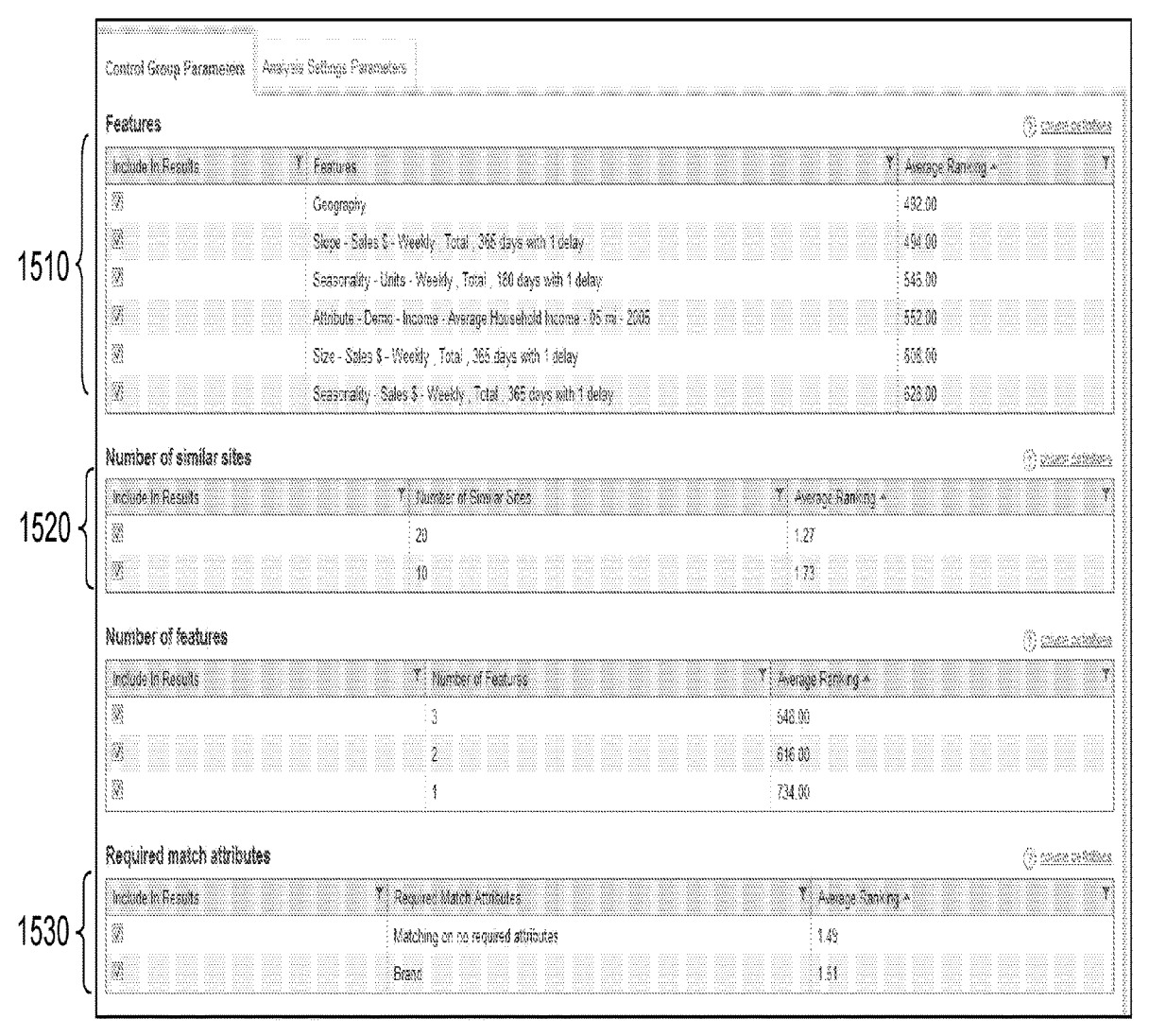

In step 1755, the client computer or host server ranks the matching criteria based upon the use of the matching criteria in the ranked control strategies. The system can display a graphical user interface, as shown in FIG. 15, that shows how well each matching criteria performs over all simulations. A table 1510 shows, for each matching criteria, an average ranking of all control strategies that contained the matching criteria. In this example, on average, the matching criteria for geography performed the best across all simulations, with simulations including the geography matching criteria having the lowest average rank of all matching criteria. Accordingly, table 1510 displays a ranking of the best matching criteria, which can then be selected to generate a model. Although only the top six matching criteria are shown in table 1510, the system can rank all of the matching criteria used in the simulations.

In addition to examining the best models, users may be encouraged to pick control strategies that contain matching criteria that perform well overall. Tables 1520, 1530 can provide insight for the parameters of number of similar sites and required match attributes. Because these are parameters of the model instead of matching criteria, a user can compare the performance of one value of the parameter against control strategies with the same matching criteria, but with different parameters. For example, a ranking of 1.27 for a value of 20 for a number of similar sites means that comparing each strategy with 20 similar sites against the same strategy but with 10 similar sites, the 20 similar sites received a rank of 1 (being better than 10 similar sites) 73% of the time. The same logic applies to the required match attributes in table 1530. These tables describe at a higher level the performance of matching criteria and other parameters.

In one embodiment, the process shown in FIG. 17 can be automated using a search algorithm. Control strategies with the lowest standard deviation of lift can be the most accurate. The system can use the search algorithm to find the best control strategies without having to computer every possible control strategy. When implementing this algorithm, the system uses the tables in FIGS. 6, 8, and 12 at the beginning, and then iteratively generates tables in FIGS. 7, 9, and 13 by examining, at each step, which are the best strategies and then slightly modifying them and computing a new standard deviation of lift from all of the cached information.

The functionality described herein can be implemented by numerous modules or components that can perform one or multiple functions. Each module or component can be executed by a computer, such as a server, having a non-transitory computer-readable medium and processor. In one alternative, multiple computers may be necessary to implement the functionality of one module or component.

Unless specifically stated otherwise as apparent from the following discussion, it is appreciated that throughout the description, discussions utilizing terms such as "processing" or "computing" or "calculating" or "determining" or "measuring" or "selecting" or "displaying" or "identifying" or "detecting" or the like, can refer to the action and processes of a data processing system, or similar electronic device, that manipulates and transforms data represented as physical (electronic) quantities within the system's registers and memories into other data similarly represented as physical quantities within the system's memories or registers or other such information storage, transmission or display devices.

The exemplary embodiments can relate to an apparatus for performing one or more of the functions described herein. This apparatus may be specially constructed for the required purposes, or it may comprise a general purpose computer selectively activated or reconfigured by a computer program stored in the computer. Such a computer program may be stored in a machine (e.g. computer) readable storage medium, such as, but is not limited to, any type of disk including floppy disks, optical disks, CD-ROMs and magnetic-optical disks, read only memories (ROMs), random access memories (RAMs) erasable programmable ROMs (EPROMs), electrically erasable programmable ROMs (EEPROMs), magnetic or optical cards, or any type of media suitable for storing electronic instructions, and each coupled to a bus.

The exemplary embodiments described herein are described as software executed on at least one server, though it is understood that embodiments can be configured in other ways and retain functionality. The embodiments can be implemented on known devices such as a personal computer, a special purpose computer, cellular telephone, personal digital assistant ("PDA"), a digital camera, a digital tablet, an electronic gaming system, a programmed microprocessor or microcontroller and peripheral integrated circuit element(s), and ASIC or other integrated circuit, a digital signal processor, a hard-wired electronic or logic circuit such as a discrete element circuit, a programmable logic device such as a PLD, PLA, FPGA, PAL, or the like. In general, any device capable of implementing the processes described herein can be used to implement the systems and techniques according to this invention.

It is to be appreciated that the various components of the technology can be located at distant portions of a distributed network and/or the Internet, or within a dedicated secure, unsecured and/or encrypted system. Thus, it should be appreciated that the components of the system can be combined into one or more devices or co-located on a particular node of a distributed network, such as a telecommunications network. As will be appreciated from the description, and for reasons of computational efficiency, the components of the system can be arranged at any location within a distributed network without affecting the operation of the system. Moreover, the components could be embedded in a dedicated machine.

Furthermore, it should be appreciated that the various links connecting the elements can be wired or wireless links, or any combination thereof, or any other known or later developed element(s) that is capable of supplying and/or communicating data to and from the connected elements. The term module as used herein can refer to any known or later developed hardware, software, firmware, or combination thereof that is capable of performing the functionality associated with that element. The terms determine, calculate and compute, and variations thereof, as used herein are used interchangeably and include any type of methodology, process, mathematical operation or technique.

The embodiments described above are intended to be exemplary. One skilled in the art recognizes that there are numerous alternative components and embodiments that may be substituted for or included in the particular examples described herein and such additions or substitutions still fall within the scope of the invention.

What is claimed is:

1. A computer-implemented method comprising:
   generating, by a server, a plurality of control strategies using a plurality of permutations of one or more matching criteria received;
   generating, by the server, a similarity score for each matching criteria by calculating a distance for each matching criteria for a plurality of randomly selected test locations paired with a plurality of potential control locations, wherein the distance is calculated as a combined sum of a normalized distance between the plurality randomly selected test locations and the plurality of potential control locations for all matching criteria, wherein each of the one or more matching criteria has a weight;
   identifying, by the server, most similar potential control locations for each test location and for each control strategy based on the similarity scores;
   calculating, by the server, a lift value for each null test within a plurality of null tests, wherein the server aggregates a lift value for each test location implementing each control strategy based upon the most similar potential control locations;

displaying, by the server on a graphical user interface, the plurality of control strategies ranked based upon their corresponding lift value, wherein a user iteratively eliminates poorly performing values and a best control strategy is selected to predict sales of a particular product over a period of time.

2. The method according to claim 1, further comprising calculating, by the server for each potential control strategy, a standard deviation for the lift value of null tests.

3. The method according to claim 2, wherein the control strategies are ranked based upon the standard deviation of the lift value of null tests.

4. The method according to claim 1, further comprising ranking, by the server, the matching criteria based upon use of the matching criteria in the ranked control strategies.

5. The method according to claim 1, further comprising receiving, by the server, an input of a number of control locations to draw for each test location in each null test.

6. The method according to claim 1, wherein the plurality of matching criteria is received from a user interacting with a graphical user interface displayed on a user device.

7. The method according to claim 1, wherein the server displays a visual representation of the lift value versus at least one attribute of at least one test location or control location.

8. The method according to claim 1, wherein the null test correspond to performing no action to a test location or a control location.

9. A computer program product embodied on a non-transitory computer readable medium, wherein the computer program product has instructions that when executed by a processor perform a method comprising:

generating, by the processor, a plurality of control strategies using a plurality of permutations of one or more matching criteria received;

generating, by the processor, a similarity score for each matching criteria by calculating a distance for each matching criteria for a plurality of randomly selected test locations paired with a plurality of potential control locations, wherein the distance is calculated as a combined sum of a normalized distance between the randomly selected test locations and the plurality of potential control locations for all matching criteria, wherein each of the one or more matching criteria has a weight;

identifying, by the processor, most similar potential control locations for each test location and for each control strategy based on the similarity scores;

calculating, by the processor, a lift value for each null test within a plurality of null tests, wherein the processor aggregates a lift value for each test location implementing each control strategy based upon the most similar potential control locations;

displaying, by the processor on a graphical user interface, the plurality of control strategies ranked based upon their corresponding lift value, wherein a user iteratively eliminates poorly performing values and a best control strategy is selected to predict sales of a particular product over a period of time.

10. A computer system comprising:

an electronic device configured to transmit one or more matching criteria to a server, the electronic device configured to display a graphical user interface populated by the server, wherein the server us configured to:

generate a plurality of control strategies using a plurality of permutations of one or more matching criteria received;

generate a similarity score for each matching criteria by calculating a distance for each matching criteria for a plurality of randomly selected test locations paired with a plurality of potential control locations, wherein the distance is calculated as a combined sum of a normalized distance between the randomly selected test locations and the plurality of potential control locations for all matching criteria, wherein each of the one or more matching criteria has a weight;

identify most similar potential control locations for each test location and for each control strategy based on the similarity scores;

calculate a lift value for each null test within a plurality of null tests, wherein the server aggregates a lift value for each test location implementing each control strategy based upon the most similar potential control locations;

display, on the graphical user interface, the plurality of control strategies ranked based upon their corresponding lift value, wherein a user iteratively eliminates poorly performing values and a best control strategy is selected to predict sales of a particular product over a period of time.

11. The computer system according to claim 10, further comprising calculating, by the server for each potential control strategy, a standard deviation for the lift value of null tests.

12. The computer system according to claim 11, wherein the control strategies are ranked based upon the standard deviation of the lift value of null tests.

13. The computer system according to claim 10, further comprising ranking, by the server, the matching criteria based upon use of the matching criteria in the ranked control strategies.

14. The computer system according to claim 10, further comprising receiving, by the server, an input of a number of control locations to draw for each test location in each null test.

15. The computer system according to claim 10, wherein the plurality of matching criteria is received from a user interacting with a graphical user interface displayed on a user device.

16. The computer system according to claim 10, wherein the server displays a visual representation of the lift value versus at least one attribute of at least one test location or control location.

* * * * *